United States Patent
Kinugasa et al.

(10) Patent No.: US 7,868,662 B2
(45) Date of Patent: Jan. 11, 2011

(54) SPIKE NOISE ELIMINATING CIRCUIT, DIGITAL SYSTEM USING THE SAME, AND IIC BUS

(75) Inventors: Norihide Kinugasa, Kyoto (JP); Sachi Ota, Osaka (JP)

(73) Assignee: Panasonic Corporation, Osaka (JP)

( * ) Notice: Subject to any disclaimer, the term of this patent is extended or adjusted under 35 U.S.C. 154(b) by 51 days.

(21) Appl. No.: 12/442,649

(22) PCT Filed: Oct. 5, 2007

(86) PCT No.: PCT/JP2007/069581

§ 371 (c)(1),
(2), (4) Date: Mar. 24, 2009

(87) PCT Pub. No.: WO2008/044639

PCT Pub. Date: Apr. 17, 2008

(65) Prior Publication Data
US 2010/0019838 A1    Jan. 28, 2010

(30) Foreign Application Priority Data
Oct. 10, 2006    (JP) .............................. 2006-276765

(51) Int. Cl.
*H03K 5/00* (2006.01)
(52) U.S. Cl. ........................................ 327/34; 327/551

(58) Field of Classification Search ......... 327/551–559, 327/34
See application file for complete search history.

(56) References Cited

U.S. PATENT DOCUMENTS

| 7,330,054 B1 * | 2/2008 | Masleid ....................... 326/121 |
| 7,548,475 B2 * | 6/2009 | Cho ........................... 365/206 |

FOREIGN PATENT DOCUMENTS

| JP | 5-34726 | 5/1993 |
| JP | 5-191226 | 7/1993 |
| JP | 7-321616 | 12/1995 |

* cited by examiner

*Primary Examiner*—Dinh T. Le
(74) *Attorney, Agent, or Firm*—Hamre, Schumann, Mueller & Larson, P.C.

(57) ABSTRACT

There is provided a spike noise eliminating circuit that can eliminate reliably spike noise having a predetermined pulse width or smaller and transmit and output precisely a signal having a pulse width larger than the predetermined width. Spike noise in the input signal is eliminated by: detecting a coincidence in level of the input signal and a first delay signal obtained by delaying the input signal by a maximum pulse width of noise to be eliminated as a delay amount; and sampling the input signal or a second delay signal obtained by delaying the input signal by a certain period of time based on a signal obtained as a result of detecting the coincidence in level.

5 Claims, 13 Drawing Sheets

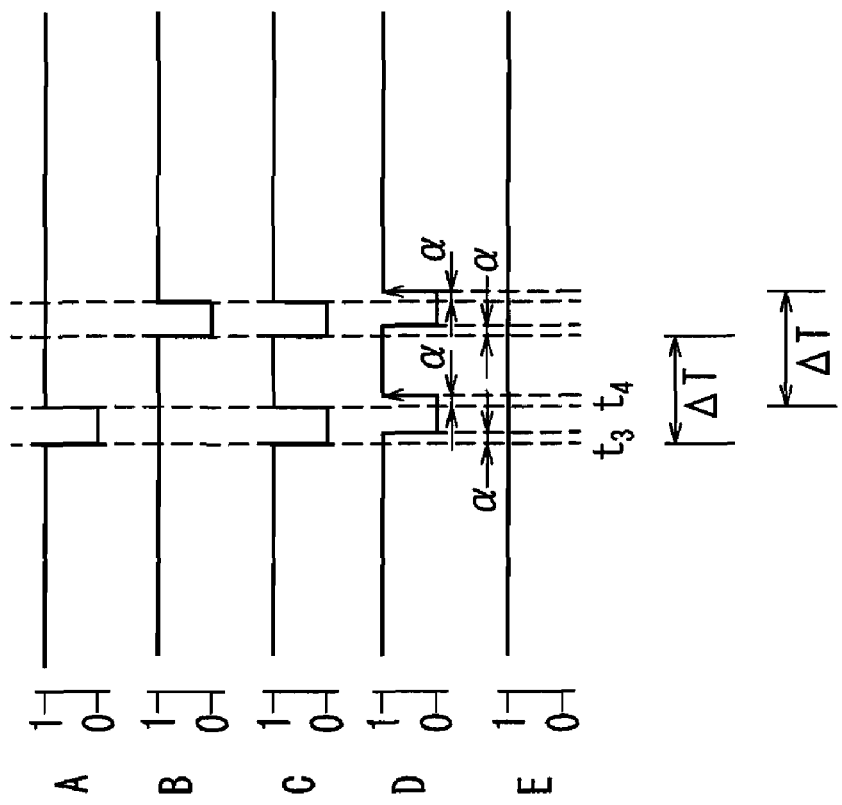
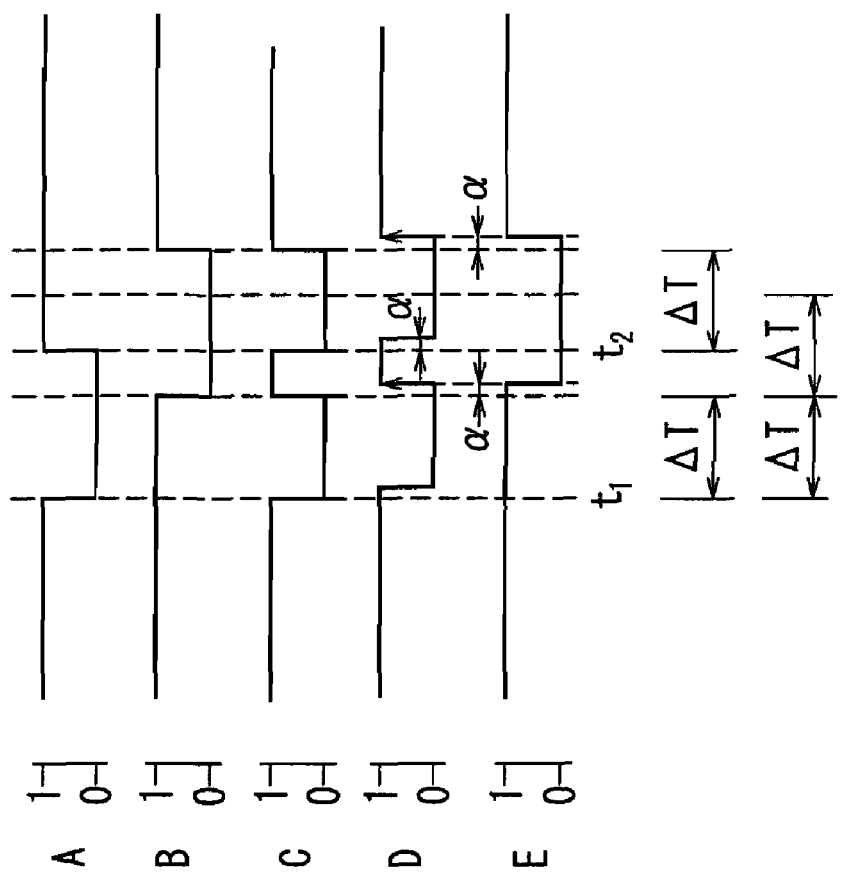
FIG. 3A
FIG. 3B

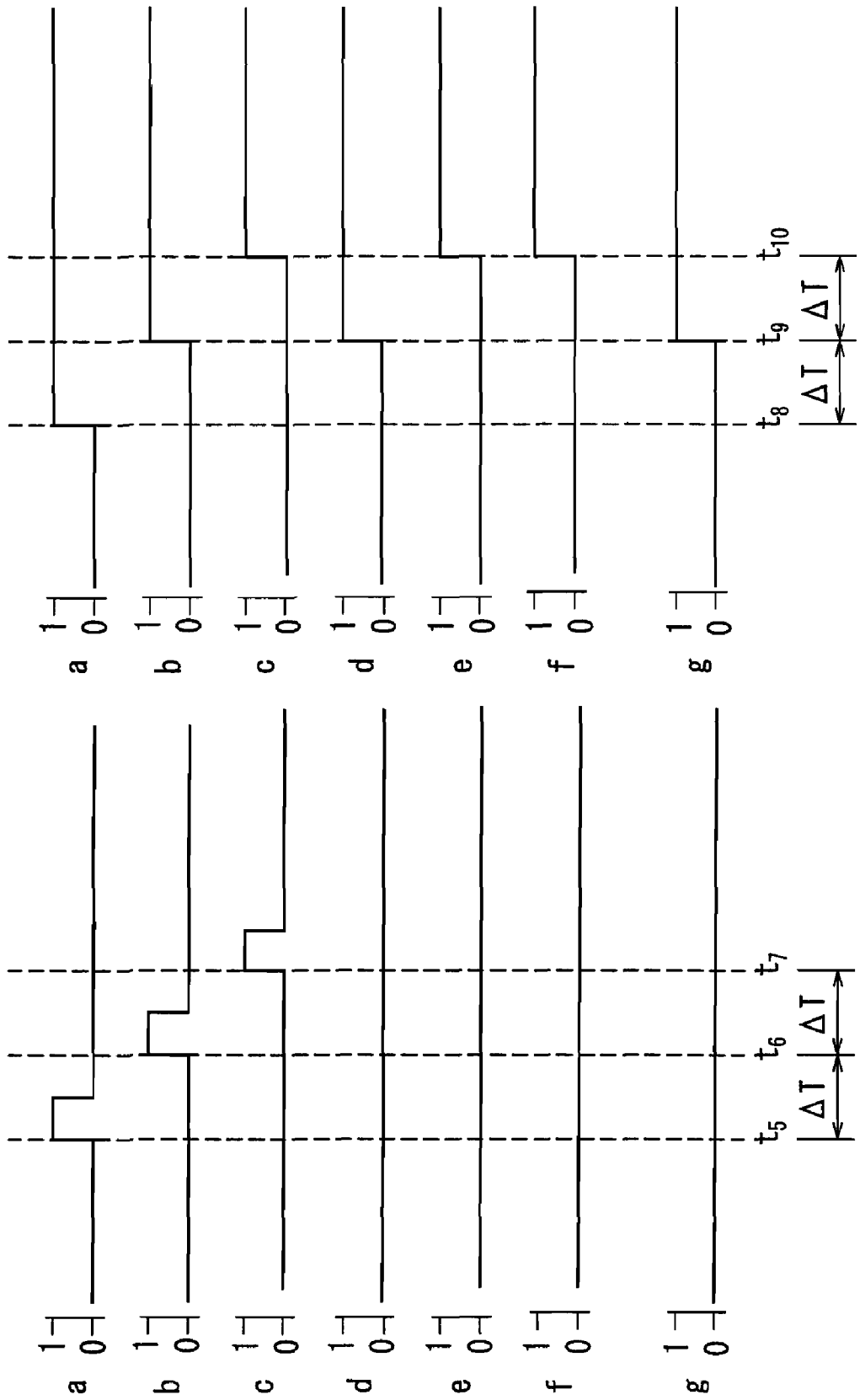

SPIKE NOISE ELIMINATING CIRCUIT, DIGITAL SYSTEM USING THE SAME, AND IIC BUS

TECHNICAL FIELD

The present invention relates to a spike noise eliminating circuit for eliminating spike noise in an input signal, and a digital system and an IIC bus that use the spike noise eliminating circuit to eliminate spike noise in an input signal.

BACKGROUND ART

Conventionally, a CR delay circuit as shown in FIG. 9 has been used in an input interface part of a digital system so as to eliminate spike noise generated in an input signal. In such a conventional CR delay circuit 50, a signal input from an input terminal 51 is delayed by a resistance 53 and a capacitance 54 via an inverter element 52, and passes through a Schmitt trigger circuit 55 to be output to an output terminal 56. However, this circuit has some problems in that integration is difficult due to the use of the resistance (R) and the capacitance (C) and that a delay amount is set with insufficient accuracy.

In order to solve these problems, a spike noise eliminating circuit as a digital circuit has been proposed that eliminates both spike noise in a positive direction generated when an input signal is "0 (Lo)" and spike noise in a negative direction generated when an input signal is "1 (Hi)" (Patent Document 1).

As shown in FIG. 10, such a spike noise eliminating circuit 60 includes two delay gates 62 and 63, three AND gates 64, 65, and 66, and one OR gate 67. An input signal a input from an input terminal 61 is delayed by the delay gate 62 by a pulse width ΔT of the spike noise to be eliminated, resulting in a delay signal b. The delay signal b further is delayed by the other delay gate 63 by ΔT, resulting in a delay signal c.

The AND gate 64 receives the input signal a and the delay signal b, and supplies an output signal d to one input terminal of the OR gate 67. The AND gate 65 receives the input signal a and the delay signal c, and supplies an output signal e to a second input terminal of the OR gate 67. The AND gate 66 receives the delay signal b and the delay signal c, and supplies an output signal f to the remaining input terminal of the OR gate 67. When the three input signals are input, the OR gate 67 outputs an output signal g to an output terminal 68. The output signal g is output from the spike noise eliminating circuit 60 as a signal obtained as a result of eliminating spike noise having a predetermined pulse width or smaller from the input signal a, and is input to a digital system or an IIC bus control system.

It should be noted that an IIC bus, which is an abbreviation of an "Inter IC bus", is a serial bus for use in communications between ICs and in a device. An IIC bus includes two bi-directional control lines for data and a clock.

Next, a description will be given of how the conventional spike noise eliminating circuit 60 can eliminate spike noise, with reference to timing charts shown in FIGS. 11A, 11B, 12A, and 12B.

FIGS. 11A and 11B show the case where the input signal is "0". FIG. 11A shows the case where spike noise is input. As shown in FIG. 11A, spike noise generated in the input signal a at a time t5 appears in the delay signal b and the delay signal c after a delay of ΔT and 2ΔT by the delay gates 62 and 63, respectively. However, since the output signals d, e, and f of the AND gates 64, 65, and 66, respectively, are all "0", the output signal g of the OR gate 67 that receives these three signals is also "0". In this manner, the input signal a has its spike noise eliminated, resulting in the output signal g.

FIG. 11B shows the case where a regular signal is added to the input signal a, so that the signal level is changed from "0" to "1". As shown in FIG. 11B, when the input signal a is changed to "1" at a time t8, the delay signal b and the delay signal c are changed accordingly after a delay of ΔT and 2ΔT, respectively. The output signal d of the AND gate 64 has its signal level changed to "1" at a time t9 after a delay of ΔT from t8, and the output signals e and f of the AND gates 65 and 66, respectively, have their signal levels changed to "1" at a time t10 after a delay of 2ΔT. Accordingly, the output signal g of the OR gate 67 is changed to "1" at t9 to be maintained as it is. In this manner, the regular input signal a is delayed by ΔT, resulting in the output signal g.

FIGS. 12A and 12B are timing charts, when the input signal a is "1", showing the case where negative spike noise is eliminated and the case where a regular signal is input so that the signal level is changed from "1" to "0", respectively. As shown in FIG. 12A, when negative spike noise is added to the input signal a at a time t5, the delay signals b and c from the two delay gates 62 and 63 and the output signals d, e, and f of the three AND gates 64, 65, and 66 are as shown in the figure. The output signal g of the OR gate 67 that receives these three signals is given as a result of eliminating the spike noise. Further, as shown in FIG. 12B, when the input signal a is changed from "1" to "0" at a time t8, the output signal g is changed from "1" to "0" at a time t9 after a delay of a predetermined time ΔT in response to the change in the input signal a.

Patent Document 1: JP 5 (1993)-191226 A

DISCLOSURE OF INVENTION

Problem to be Solved by the Invention

Here, consideration is given to the case where a signal having a pulse shape longer than ΔT and shorter than 2ΔT is input to the conventional spike noise eliminating circuit 60 as described above.

FIG. 13A shows the case where the input signal a is "0" and a positive signal having a pulse width larger than "ΔT" and smaller than "2ΔT", which is twice as large as ΔT, is input at a time t11. Since a period in which the signal is "1" has a width from t11 to t12, the following relationship is satisfied: ΔT<signal width (t12−t11)<2ΔT.

In this case, since the AND gate 64 receives the input signal a and the delay signal b that is delayed by the delay gate 62 by ΔT, it outputs the output signal d of "1" during a period from a time (t11+ΔT) to t12. Further, the AND gate 66 outputs the output signal f of "1" during a period from (t11+2ΔT) to (t12+ΔT), which corresponds to a period in which the delay signal b of "1" and the delay signal c of "1" from the delay gate 63 overlap each other. The output signal e of the AND gate 65 that receives the input signal a and the delay signal c remains "0". Accordingly, the output signal g of "1" of the OR gate 67 is output twice as a short pulse during the period from the time (t11+ΔT) to t12 and the period from the time (t11+2ΔT) to (t12+ΔT).

Similarly, FIG. 13B shows the case where the input signal a is "1" and a negative signal having a pulse width larger than "ΔT" and smaller than "2ΔT" is input at the time t11. Also in the case of FIG. 13B, the output signal g of "0" is output twice as a short pulse during the period from the time (t11+ΔT) to t12 and the period from the time (t11+2ΔT) to (t12+ΔT), as in the case of FIG. 13A.

As described above, when a signal having a pulse width larger than ΔT, which is a width of the spike noise to be eliminated, and smaller than 2ΔT, which is twice as large as ΔT, is input, the conventional spike noise eliminating circuit cannot output a regular signal, and malfunctions by outputting two pulse signals as output signals.

Needless to say, a spike noise eliminating circuit for use in a digital system is required to have high accuracy and operation stability. Thus, it should ensure not only that noise having a pulse width not greater than that specified as a width of the spike noise to be eliminated is eliminated precisely, but also that no malfunction occurs when a regular signal pulse not to be eliminated is input.

The present invention has been conceived to solve the conventional problem as described above, and it is an object of the present invention to provide a spike noise eliminating circuit that can eliminate reliably spike noise having a predetermined pulse width or smaller and transmit and output precisely a signal having a pulse width larger than the predetermined width.

Means for Solving Problem

In order to solve the above-described problem, a spike noise eliminating circuit according to the present invention eliminates spike noise in an input signal by: detecting a coincidence in level of the input signal and a first delay signal obtained by delaying the input signal by a maximum pulse width of noise to be eliminated as a delay amount; and sampling the input signal or a second delay signal obtained by delaying the input signal by a certain period of time based on a signal obtained as a result of detecting the coincidence in level.

Effects of the Invention

With this configuration, it is possible to eliminate reliably spike noise having a predetermined width or smaller and to output precisely a signal having a width not smaller than that of noise to be eliminated.

BRIEF DESCRIPTION OF DRAWINGS

FIGS. 3A and 3B are timing charts for explaining an operation of the spike noise eliminating circuit of the present invention.

FIGS. 11A and 11B are timing charts for explaining an operation of the conventional spike noise eliminating circuit.

EXPLANATION OF LETTERS OR NUMERALS

Figure 1:
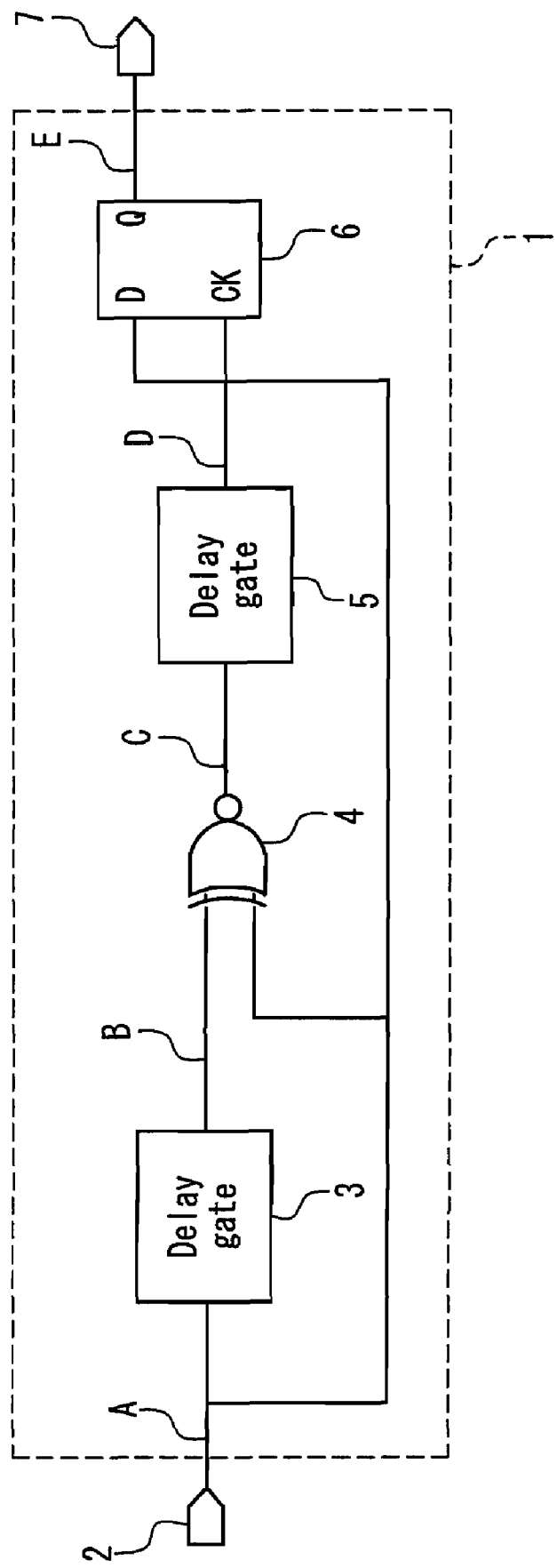
FIG. 1 is a block diagram showing a circuit configuration of a spike noise eliminating circuit according to an embodiment of the present invention.

1 Spike noise eliminating circuit
2 Input terminal
3 Delay gate
4 Coincidence detection gate
5 Delay gate
6 Flip flop
7 Output terminal
8 Delay circuit
10 Synchronization signal (horizontal or vertical)
11 Output synchronization signal
12 Video display output signal group
50 CR delay circuit
51 Input terminal
52 Inverter element
53 Resistance
54 Capacitance
55 Schmitt trigger circuit
56 Output terminal
60 Spike noise eliminating circuit
61 Input terminal
62 Delay gate
63 Delay gate
64 AND gate
65 AND gate
66 AND gate
67 OR gate
68 Output terminal
100 Digital system
110 Input interface (I/F) part
120 Digital block
200 IIC bus
201 Serial data input/output terminal (SDA)
202 Serial clock input/output terminal (SCL)
203 Surge protection element
204 Schmitt buffer
205 Serial data output signal slope control part
206 Open-drain n-MOS FET
207 Surge protection element
208 Schmitt buffer
210 Input interface part
220 Transmission/reception control part

DESCRIPTION OF THE INVENTION

In the above-described spike noise eliminating circuit, the first delay signal used in the detection of the coincidence in level or a signal obtained by a delay circuit for delaying the input signal by a predetermined period of time may be used as the second delay signal obtained by delaying the input signal by a certain period of time.

It is preferable that the input signal or the second delay signal obtained by delaying the input signal by a certain period of time is sampled by a flip flop that receives at a clock input terminal a signal obtained by delaying an output signal of a coincidence gate for detecting the coincidence in level and receives at a data input terminal the input signal or the second delay signal obtained by delaying the input signal by a certain period of time.

It is preferable that a digital system configured to eliminate spike noise in an input interface part or a serial clock input part and a serial data input part in IIC bus control use the spike noise eliminating circuit according to the present invention so as to eliminate the spike noise.

Hereinafter, embodiments of the present invention will be described with reference to the drawings.

First Embodiment

FIG. 1 is a block diagram showing a circuit configuration of a spike noise eliminating circuit 1 according to an embodiment of the present invention. The spike noise eliminating circuit 1 of the present embodiment includes a delay gate 3 for delaying a signal input from an input terminal 2, a coincidence detection gate 4, another delay gate 5, and a flip flop (FF) 6.

An input signal A is given a predetermined delay amount that is the same as a maximum pulse width of noise to be eliminated by the first delay gate 3, and is input to the coincidence detection gate 4 as a first delay signal B. The coincidence detection gate 4 detects a coincidence of the first delay signal B and the input signal A, and outputs an output signal C. The output signal C is delayed slightly by the second delay gate 5, resulting in a delay signal D, which then is input to a clock input terminal (CK) of the flip flop 6. Further, the input signal A is input to a data input terminal (D) of the flip flop 6, and a non-inverted output signal of the flip flop 6 is output as an output signal E of the spike noise eliminating circuit 1. In this manner, a coincidence in level of the input signal A and the first delay signal B obtained by delaying the input signal A by a maximum pulse width of noise to be eliminated as a delay amount is detected, and the signal C obtained as a result of detecting the coincidence in level can be used to sample the input signal A.

Next, signal processing will be described with reference to timing charts in FIGS. 2A, 2B, 3A, and 3B for explaining an operation of the spike noise eliminating circuit 1 of the present embodiment.

Figure 2B:
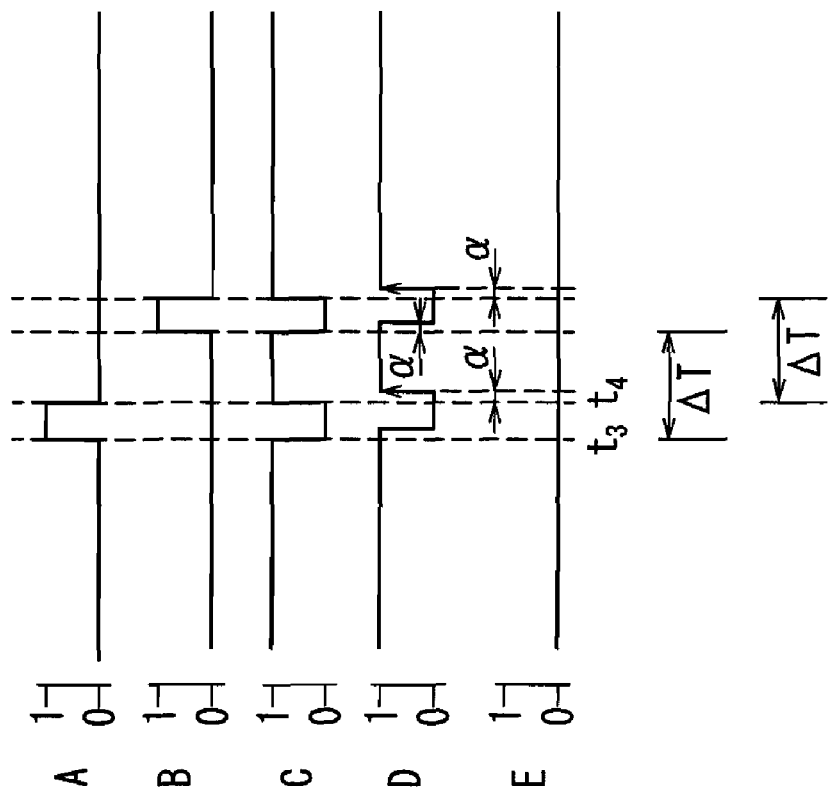
FIGS. 2A and 2B are timing charts for explaining an operation of a spike noise eliminating circuit of the present invention.
Figure 2A:
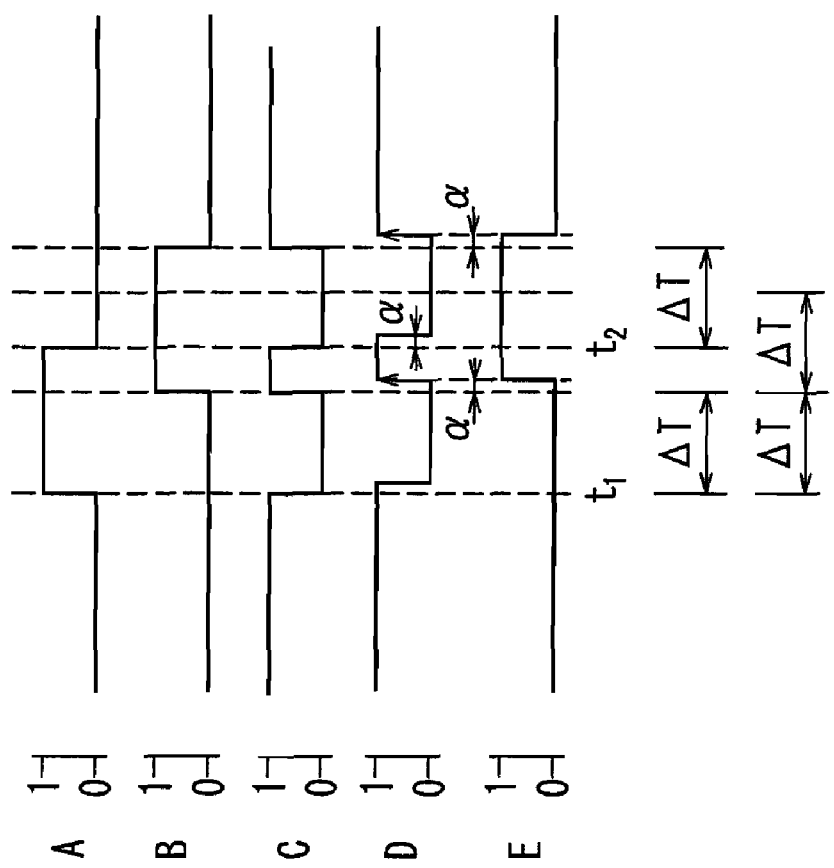

FIGS. 2A and 2B show the case where the input signal is "0". FIG. 2A is a timing chart in the case where a signal having a width larger than "ΔT" and smaller than "2ΔT" is input, where a delay amount ΔT is a maximum pulse width of noise to be eliminated. Under these circumstances, the conventional spike noise eliminating circuit malfunctions.

At a time t1, a positive signal having a pulse width larger than ΔT as a maximum pulse width of noise to be eliminated and smaller than "2ΔT" is input. Since the pulse width of this signal is t2–t1, the following relationship is satisfied: ΔT<signal width (t2–t1)<2ΔT.

The first delay signal B output from the delay gate 3 is a signal obtained by delaying the input signal A by ΔT. The output signal C of the coincidence detection gate 4 that recognizes a coincidence of the input signal A and the first delay signal B is "0" only during a period of ΔT from the time t1 and a period of ΔT from a time t2 as shown in the figure. In other words, a rising edge of the signal C appears at a time t1+ΔT and a time t2+ΔT. The signal C is delayed by the second delay gate 5 by a slight delay amount (delay time α), resulting in the signal D, which then is used to sample the input signal A by the flip flop 6. Thus, the signal is sampled at a time t1+ΔT+α and a time t2+ΔT+α, and the signal obtained from the flip flop 6 rises at the time t1+ΔT+α and falls at the time t2+ΔT+α. As a result, the signal having a pulse width (t2–t1) is output after a delay of ΔT+α, which means that the input signal A is transmitted properly.

FIG. 2B is a timing chart in the case where spike noise having a pulse width smaller than the predetermined pulse width ΔT is input.

In the case where spike noise having a pulse width (t4–t3) <ΔT is input at a time t3, the delay signal B delayed by the delay gate 3 by ΔT and the input signal A differ from each other when one of them is "1" due to the noise. Accordingly, the output signal C of the coincidence detection gate 4 is "0" only during these periods. In other words, a rising edge of the signal appears at a time t4 and a time t4+ΔT.

The signal D obtained by delaying the signal C by a slight delay amount α is input to the clock input terminal of the flip flop 6, so that the input signal A is sampled. Since the level of the input signal A is "0" when it is sampled at a time t4+α and a time t4+ΔT+α, the output signal E remains "0", which means that the spike noise has been eliminated.

FIGS. 3A and 3B show the case where the input signal is "1". FIG. 3A is a timing chart in the case where a signal having a width larger than "ΔT" and smaller than "2ΔT" is input, and FIG. 3B is a timing chart in the case where spike noise having a pulse width smaller than the predetermined pulse width ΔT is input.

As shown in FIG. 3A, even when a negative signal having a pulse width (t2–t1) is input at a time t1, the output signal C of the coincidence gate 4 is the same as that in FIG. 2A, since a coincidence is detected irrespective of direction. The output signal C is delayed by a slight delay amount for sampling. Since the input signal A is "0" at a time t1+ΔT+α and "1" at a time t2+ΔT+α, the output signal E obtained from the flip flop 6 falls at the time t1+ΔT+α and rises at the time t2+ΔT+α. As a result, the negative signal having a pulse width (t2–t1) is output after a delay of ΔT+α, which means that the input signal A is transmitted properly.

FIG. 3B is a timing chart in the case where spike noise having a pulse width smaller than the predetermined pulse width ΔT is input. Similarly, the output signal C of the coincidence gate 4 is the same as that in FIG. 2B. Since the input signal A is "1" when it is sampled at a time t4+α and a time t4+ΔT+α, the output signal E remains "1", which means that the spike noise has been eliminated.

Figure 4:
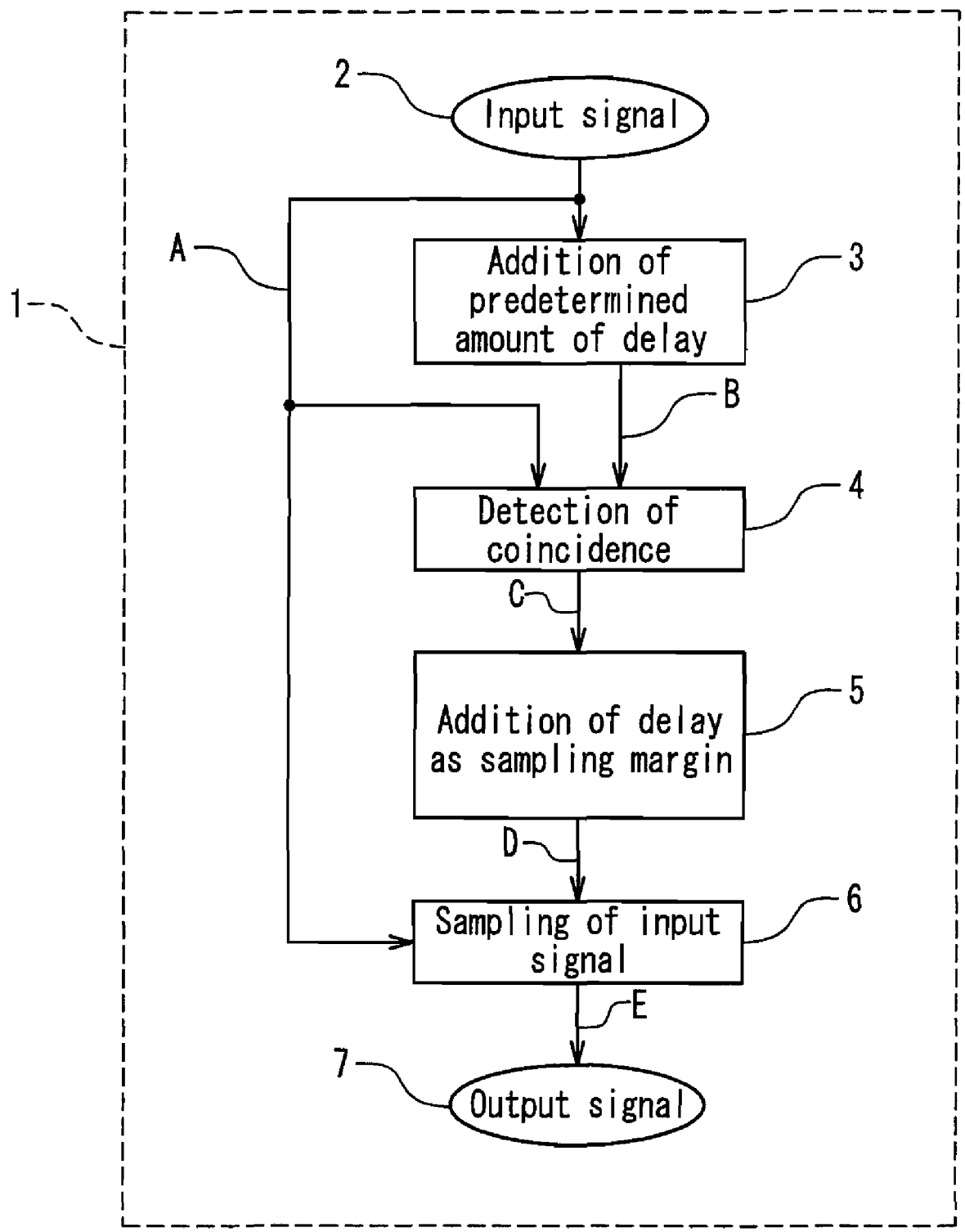
FIG. 4 is a flowchart showing a technique for eliminating noise by the spike noise eliminating circuit of the present invention.

FIG. 4 is a flowchart showing a flow of the signal processing for explaining the technique used in the spike noise eliminating circuit of the present embodiment as shown in the timing charts in FIGS. 2A, 2B, 3A and 3B above.

As shown in FIG. 4, in the spike noise eliminating circuit 1 of the present embodiment, the coincidence detection gate 4 detects a coincidence of the input signal A input from the input terminal 2 and the first delay signal B obtained by adding a predetermined amount of delay as a pulse width of noise to be eliminated to the input signal A by the delay gate 3, and outputs the signal C. The delay gate 5 adds a slight amount of delay as a sampling margin to the signal C, thereby obtaining the signal D. The input signal is sampled at a timing when the signal D rises, so that the output signal E is obtained from the flip flop 6 as a non-inverted output.

As described above, the spike noise eliminating circuit according to the present embodiment delays a signal only once by a predetermined amount of delay determined by a pulse width of noise to be eliminated, thereby generating a signal. Thus, a delay of "2ΔT" as in the conventional spike noise eliminating circuit does not occur, so that a signal having a pulse width between "ΔT" and "2ΔT" does not cause a malfunction of a special case. Further, in the case of a signal having a pulse width not smaller than ΔT, an original signal is sampled at a timing of both edges of a signal delayed by ΔT. In the case of spike noise to be eliminated having a pulse width not greater than ΔT, an original signal is sampled at a timing of a trailing edge of a spike noise signal and a signal delayed by ΔT. In this manner, the processing can be performed separately for spike noise having a pulse width smaller than ΔT and a regular signal having a pulse width larger than ΔT.

The present embodiment has been described taking as an example the case where the input signal A is used as signal to be sampled. However, the present invention is not limited thereto. For example, a second delay signal obtained by delaying the input signal A by a certain period of time not greater than ΔT may be used as a signal to be sampled.

Here, a delay time (β) of the second delay signal is not limited particularly as long as it is not greater than ΔT. Thus, for example, the first delay signal B obtained by delaying the input signal A by a pulse width ΔT of noise to be eliminated may be used as it is as the second delay signal.

Figure 5:
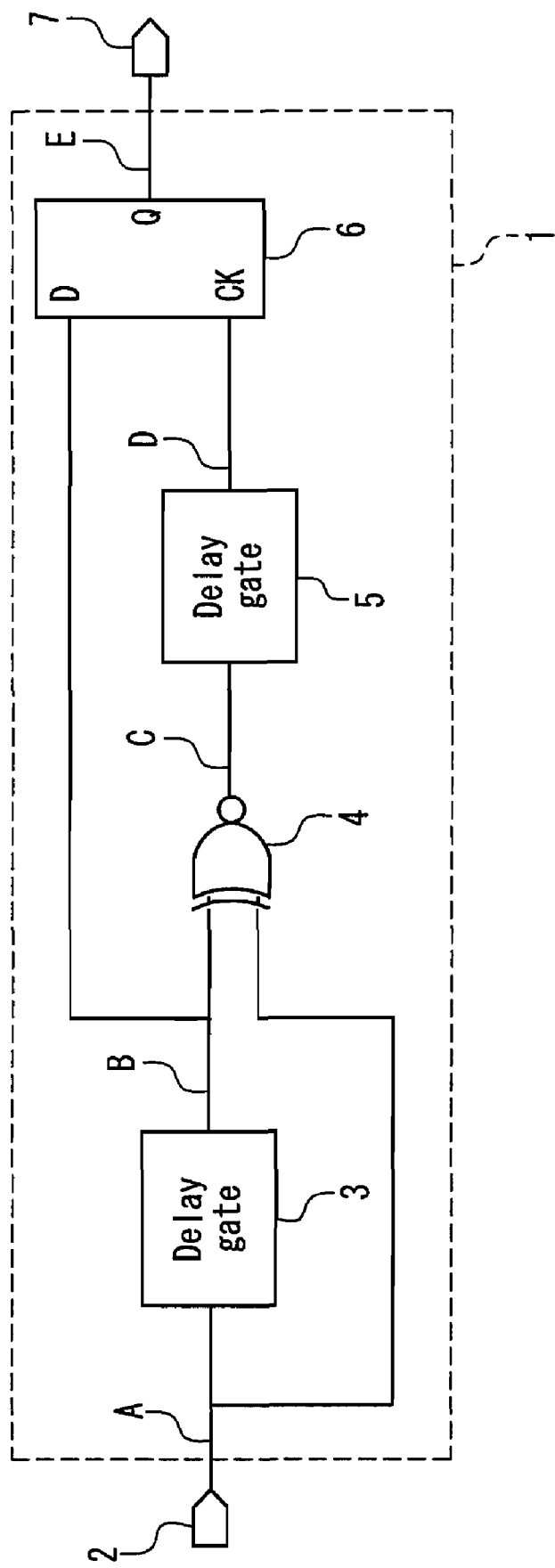
FIG. 5 is a block diagram showing a circuit configuration of a spike noise eliminating circuit in a first application example of the embodiment of the present invention.

FIG. 5 is a block diagram showing a circuit configuration of a spike noise eliminating circuit in a first application example of the present embodiment. In the first application example, the first delay signal B is used as the second delay signal that is a sampling signal.

The spike noise eliminating circuit 1 in the first application example of the present embodiment as shown in FIG. 5 has the same circuit components as those in the spike noise eliminating circuit 1 of the present embodiment as shown in FIG. 1, and has a different circuit configuration in that the first delay signal B output from the delay gate 3 for delaying the signal input from the input terminal 2 is input to the data input terminal (D) of the flip flop (FF) 6.

It is evident from the timing charts shown in FIGS. 2A, 2B, 3A, and 3B that the spike noise eliminating circuit in the first application example of the present embodiment that uses the first delay signal B as the second delay signal that is a sampling signal as shown in FIG. 5 also is operated in the same manner as that for the spike noise eliminating circuit of the present embodiment as shown in FIG. 1. More specifically, according to the spike noise eliminating circuit of the present embodiment, the signal input to the flip flop 6 is sampled based on the signal D, and the non-inverted output signal of the flip flop 6 is output from the spike noise eliminating circuit 1 as the output signal E. It is evident from FIGS. 2A, 2B, 3A, and 3B that the output signal E is the same even when the signal to be sampled by the flip flop 6 is changed from the input signal A to the first delay signal B.

As in the first application example, in the case where the first delay signal B is used as a signal to be sampled instead of the input signal A as it is, it can be expected that a pulse (whisker) noise, which always may be mixed for a given short time when the input signal A is used, will disappear via the delay gate 3 that gives ΔT.

Figure 6:
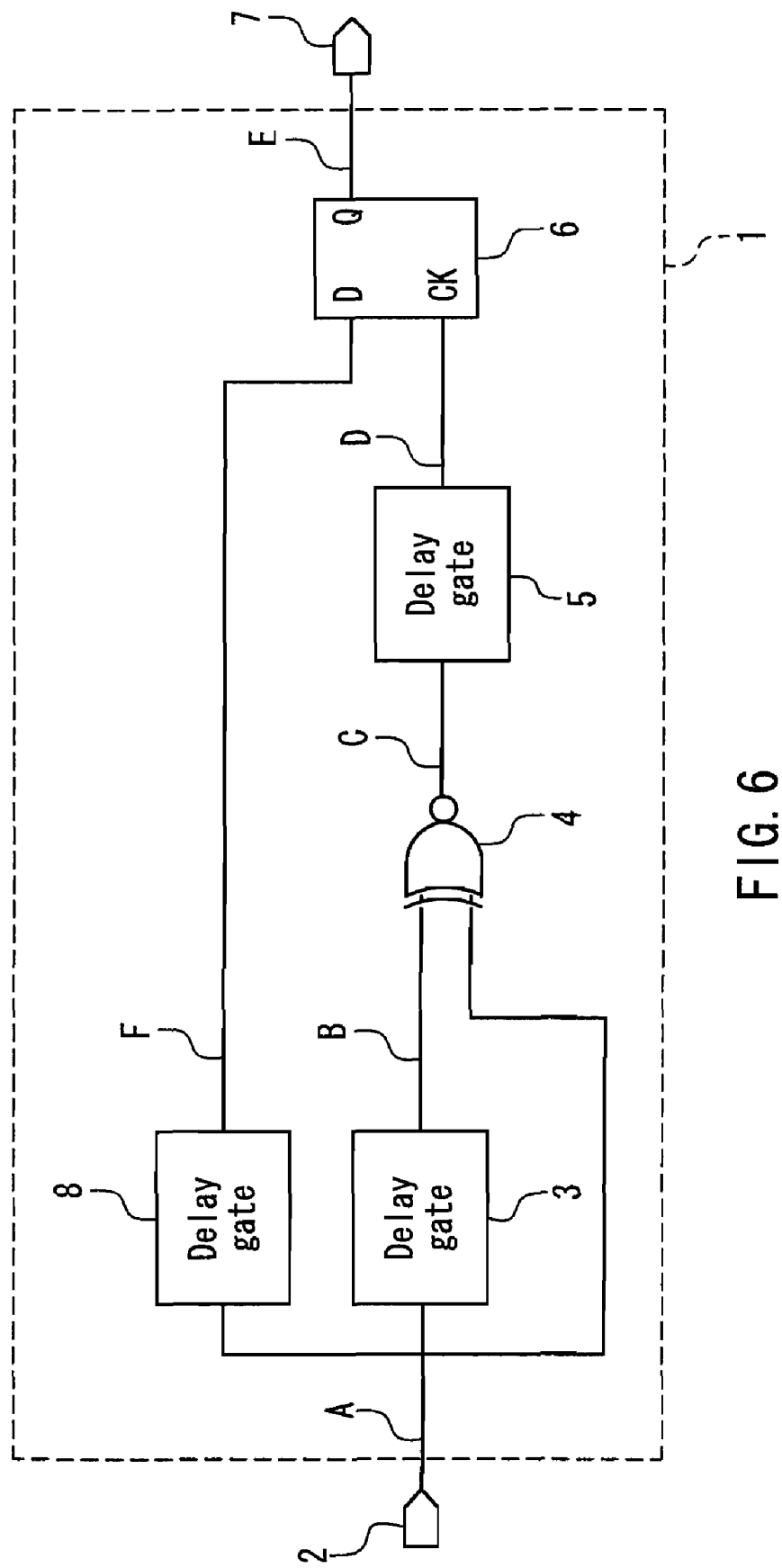
FIG. 6 is a block diagram showing a circuit configuration of a spike noise eliminating circuit in a second application example of the embodiment of the present invention.

As described above, a signal obtained by adding an arbitrary delay amount β to the input signal A can be used as the second delay signal having a delay time (β) not greater than ΔT. FIG. 6 is a block diagram showing a circuit configuration of a spike noise eliminating circuit 1 in a second application example of the present embodiment that uses a signal obtained by adding an arbitrary delay amount β not greater than ΔT to the input signal A.

In the second application of the spike noise eliminating circuit of the present embodiment as shown in FIG. 6, a delay circuit 8 for adding a predetermined delay amount β to the input signal A is provided. A signal F obtained by delaying the input signal A by the delay time β is input to the data input terminal (D) of the flip flop 6. Also in the second application example, the same output signal E of the spike noise eliminating circuit 1 can be obtained as in the first application example of using the first delay signal B as the second delay signal.

Needless to say, the delay circuit 8 used in the second application example may be a commonly used delay gate as for the other delay elements. Further, since the delayed signal is used as a signal to be sampled, it can be expected as in the above-described first application example that a pulse noise that may be mixed in the input signal A will be eliminated by the delay circuit 8.

When the input signal A is used as it is as a signal to be sampled as in the present embodiment, there is an advantage in that a large operating margin for the circuit can be secured as compared with the first and second application examples where the second delay signal obtained by delaying the input signal A by the predetermined time β is used as a signal to be sampled. Thus, taking into consideration whether or not a pulse noise mixed in the input signal should be eliminated and the operating margin for the circuit should be secured, the spike noise eliminating circuit of the present embodiment may be selected as appropriate from the one shown in FIG. 1 and the one shown in FIG. 5 or 6 given as the application example.

Second Embodiment

Figure 7:
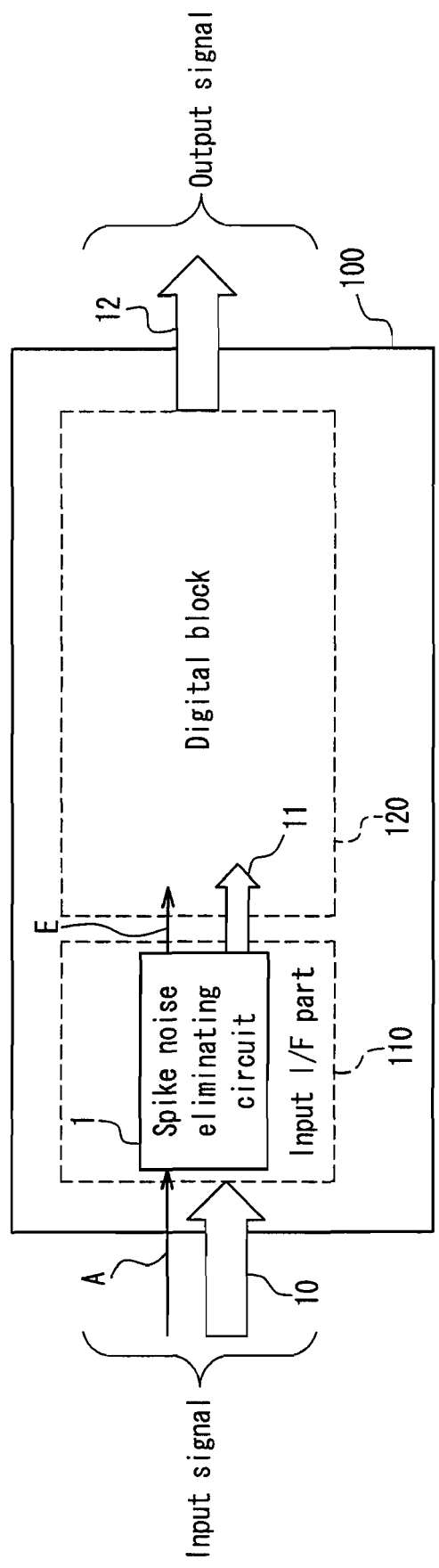
FIG. 7 is a block diagram showing a configuration of a digital system using the spike noise eliminating circuit of the present invention.

FIG. 7 is a block diagram showing a configuration of a digital system 100 using the spike noise eliminating circuit 1 of the present invention in an input interface (I/F) part 110.

As shown in the figure, input signals input to a digital block 120 are a horizontal synchronization signal and a vertical synchronization signal synchronized with a video signal in a video display LSI or the like, for example. A horizontal/vertical synchronization signal 10, which is a reference timing signal for a horizontal/vertical display in display control in the digital block 120, is input to the input terminal 2 of the spike noise eliminating circuit 1 of the present invention. The digital block 120 includes a horizontal PLL mainly for processing of controlling a horizontal display and generating a display output signal, and a processing part mainly for processing of controlling a vertical display and generating a video display output signal group 12, which generally is called a vertical countdown.

Thus, with the configuration of the second embodiment, the spike noise eliminating circuit 1 of the present invention eliminates spike noise mixed in a horizontal synchronization signal and a vertical synchronization signal as reference input signals, and outputs an output synchronization signal 11, whereby a stable video display can be achieved.

Figure 8:
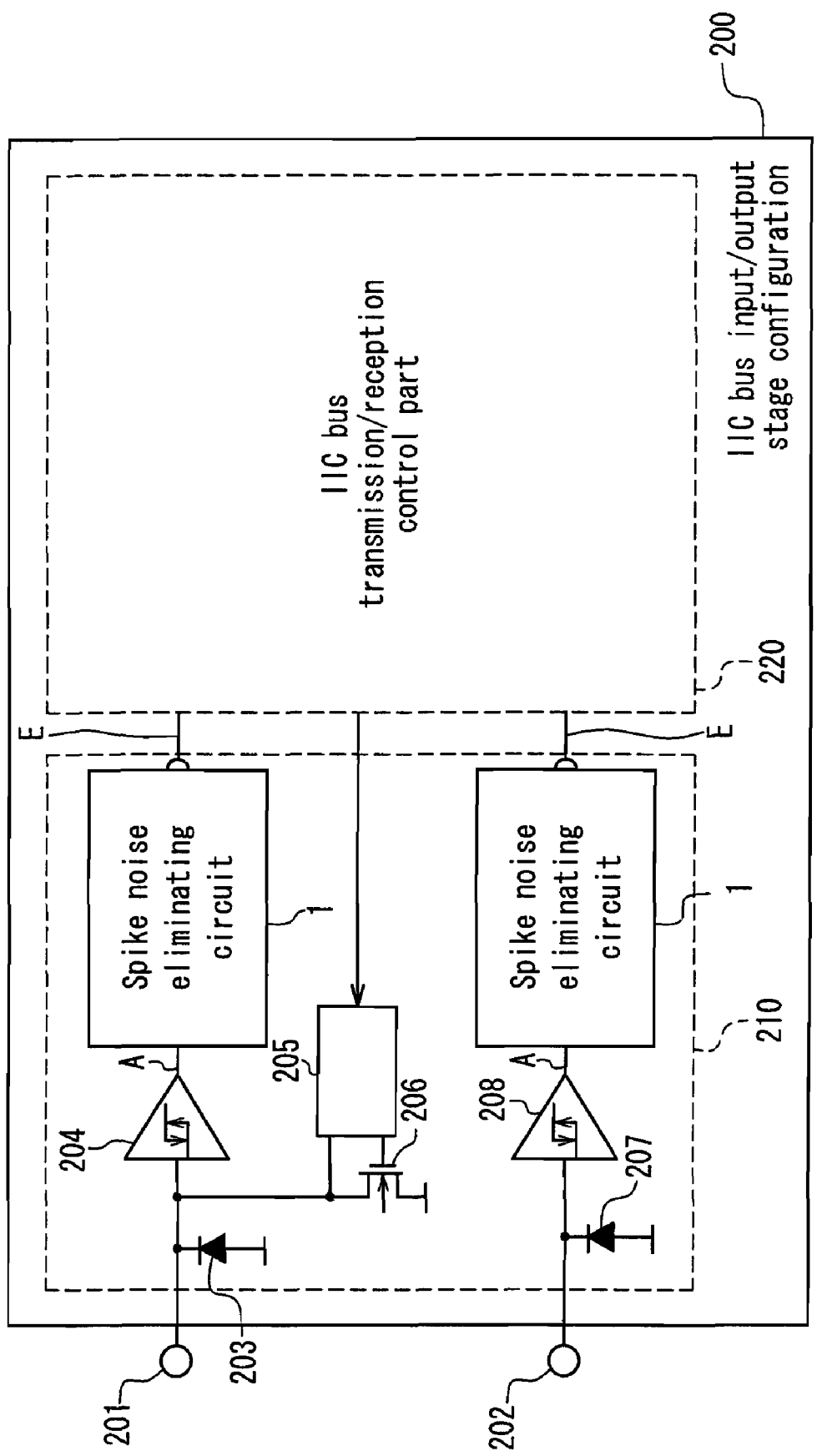
FIG. 8 is a block diagram showing a configuration of an IIC bus using the spike noise eliminating circuit of the present invention.
Figure 9:
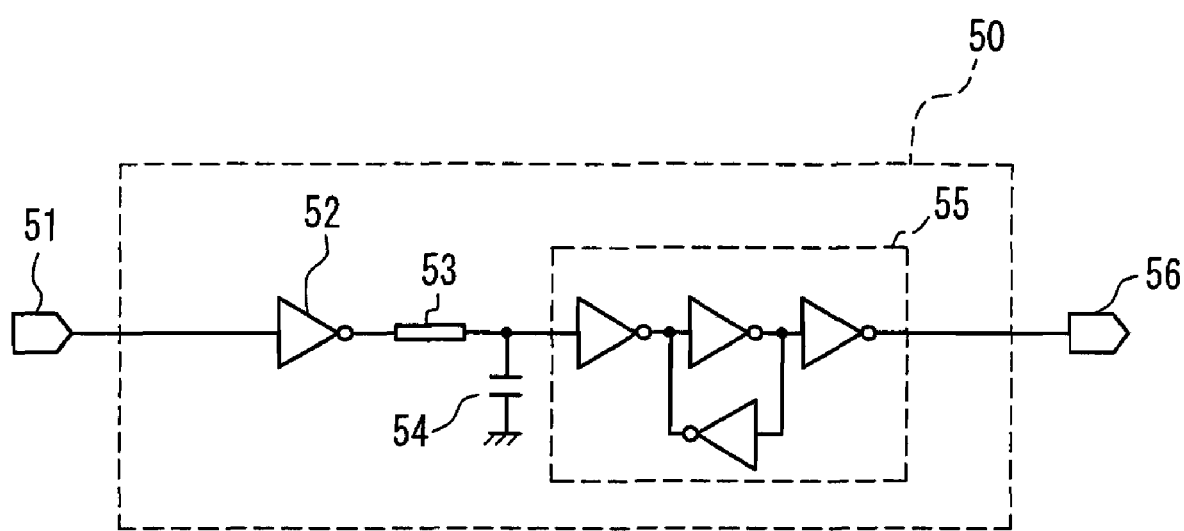
FIG. 9 is a circuit diagram showing a configuration of a conventional CR delay circuit.
Figure 10:
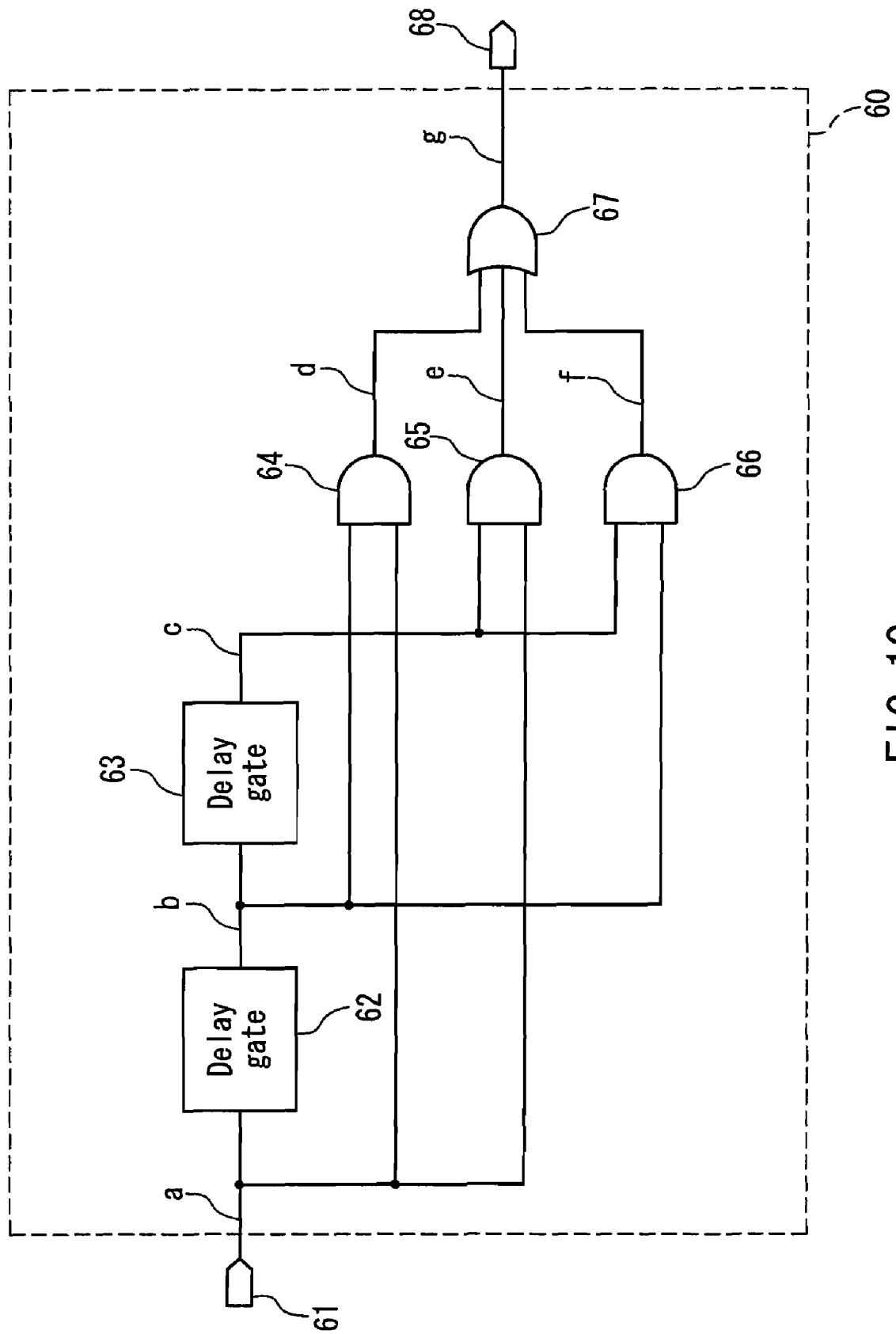
FIG. 10 is a circuit diagram showing a configuration of a conventional spike noise eliminating circuit.
Figure 12B:
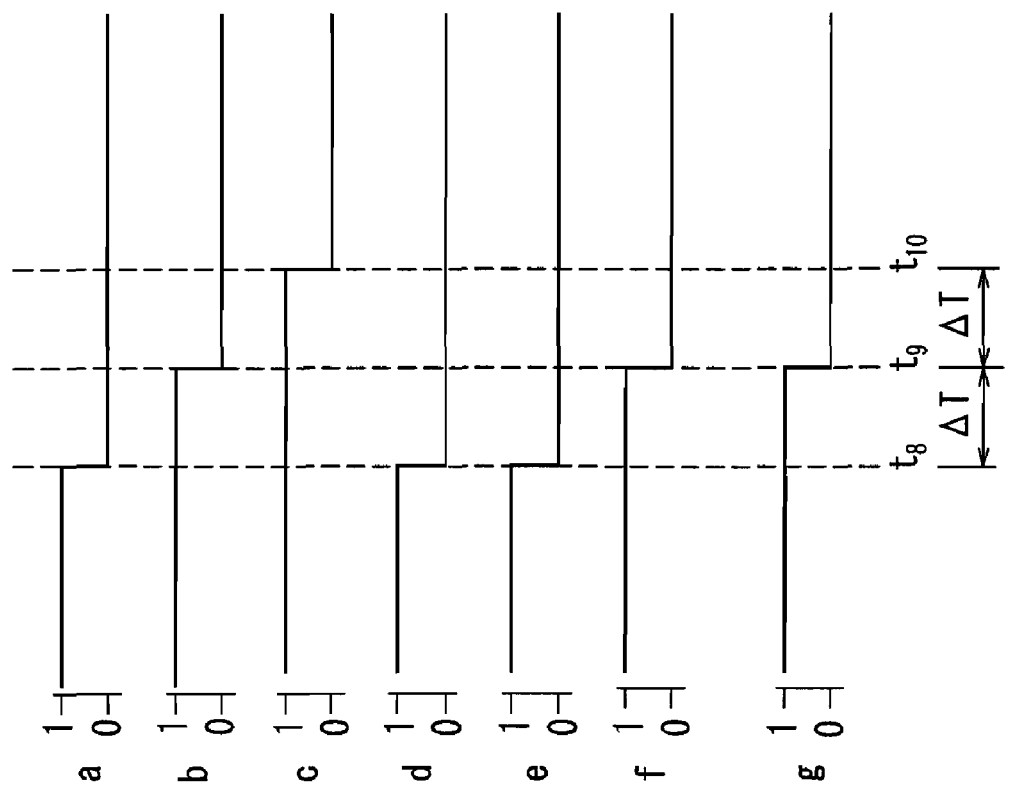
FIGS. 12A and 12B are timing charts for explaining an operation of the conventional spike noise eliminating circuit.
Figure 12A:
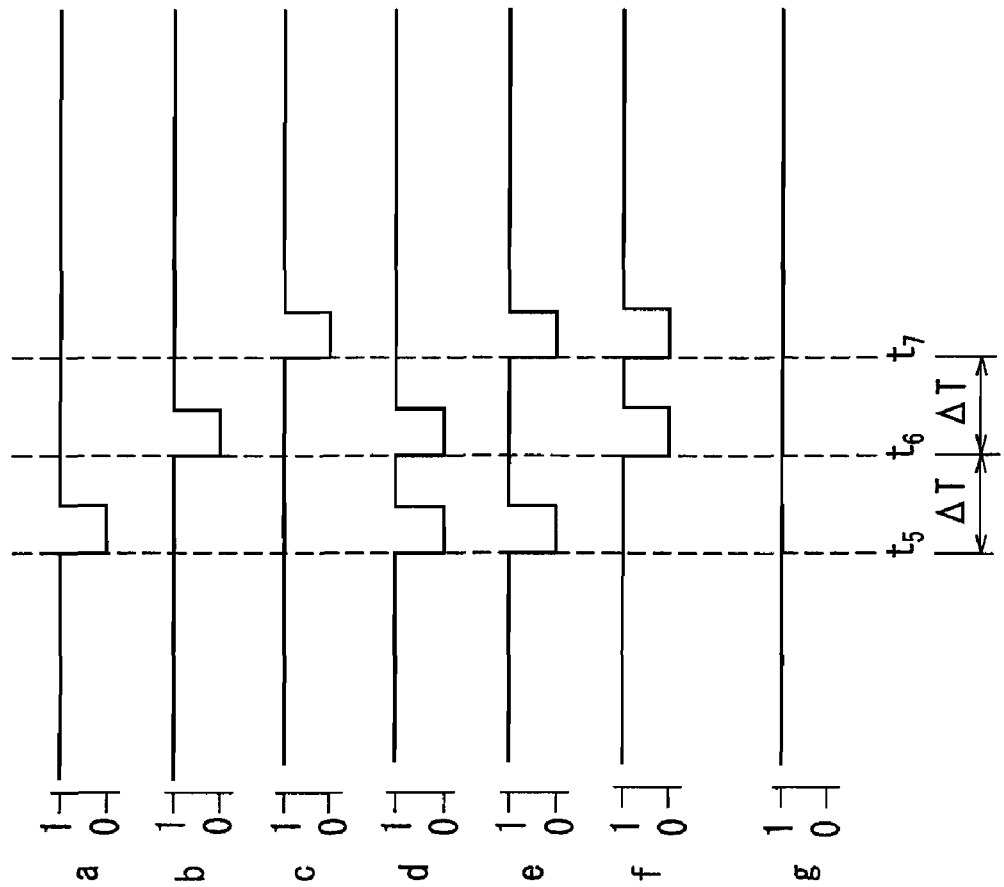
Figures 13A, 13B:
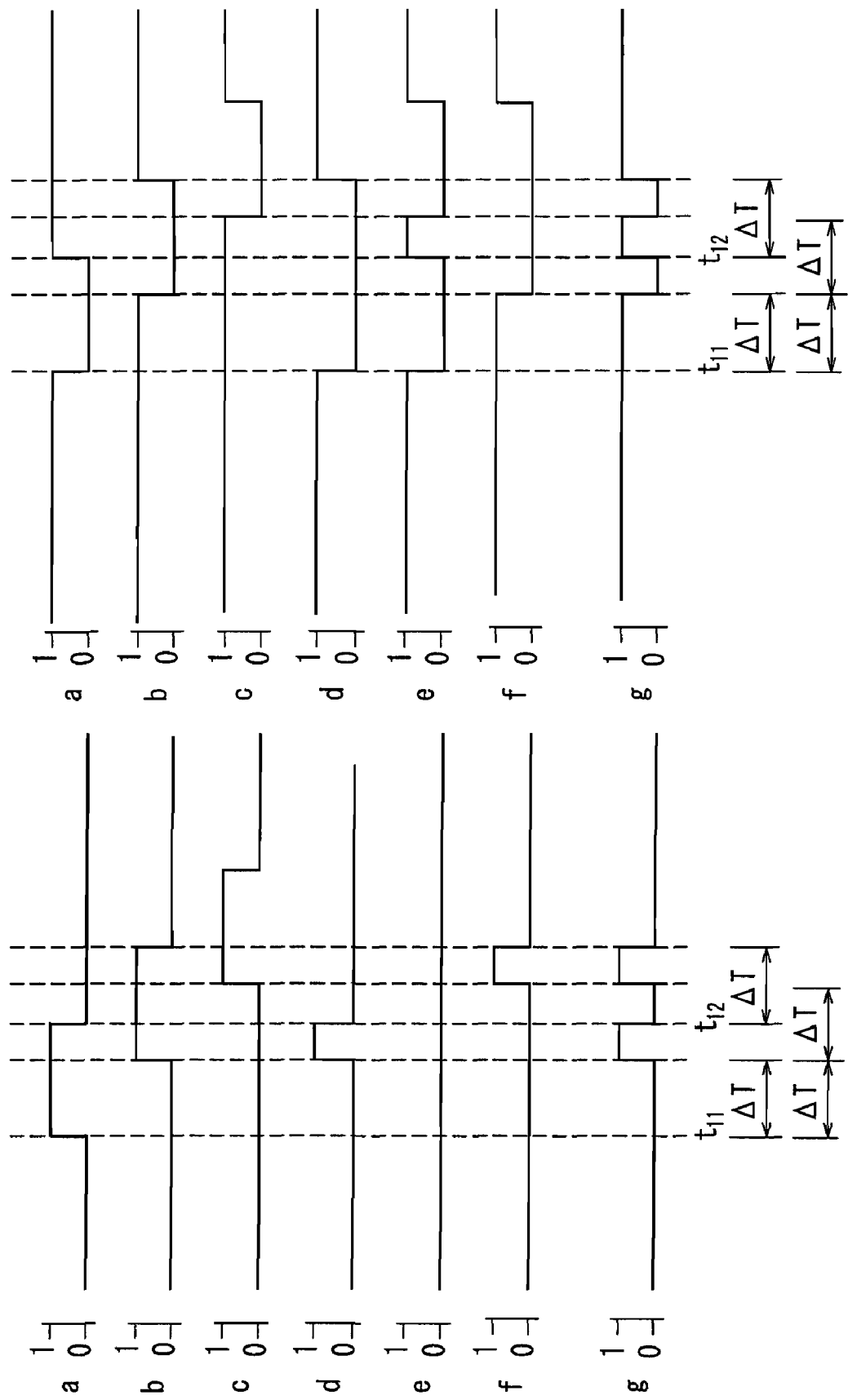
FIGS. 13A and 13B are timing charts for explaining an operation of the conventional spike noise eliminating circuit.

FIG. 8 is a block diagram in the case where the spike noise eliminating circuit 1 of the present invention is used in an input/output stage configuration 200 of an IIC bus.

A serial clock and serial data are used to control transmission and reception by the IIC bus. In an input interface part 210, when serial data is received, an input/output terminal 201 for serial data serves as an input terminal to receive a signal of the serial data, and a serial clock input terminal 202 receives a serial clock signal so as to control the reception of the serial data. When these input signals have their spike noises eliminated, they are sent to a transmission/reception control part 220 of the IIC bus. Reference numerals 205 and 206 in the figure denote a block and an n-MOSFET with an open drain output, respectively, when serial data is transmitted. The component denoted by 205 generally is called a serial data output signal slope control part.

With the configuration of the present embodiment, each of the serial data input signal and the serial clock input signal is input as the input signal A to the spike noise eliminating circuit 1 of the present invention via a Schmitt circuit 204 or 208, so that spike noise having a predetermined certain width or greater that cannot be eliminated by the Schmitt circuit can be eliminated. Especially in IIC bus control, an allowable predetermined width for spike noise is defined by specifications for a bus. Reference numerals 203 and 207 denote surge protection elements.

INDUSTRIAL APPLICABILITY

As described above, the present invention can provide a spike noise eliminating circuit with high accuracy and stability that can eliminate as spike noise a signal having a pulse width smaller than a predetermined width and transmit as a regular signal a signal having a pulse width larger than the predetermined width.

Therefore, it is applicable to an input interface part of a digital system such as a video display controller and IIC bus control, ensuring the prevention of a malfunction and a reliable operation.

The invention claimed is:

1. A spike noise eliminating circuit comprising:
a first delay gate that delays an input signal by a predetermined period of time;
an arithmetic logic circuit that performs an exclusive logical operation on an output signal of the first delay gate and the input signal;
a second delay gate that delays an output signal of the arithmetic logic circuit; and
a flip flop circuit that receives the input signal at a data terminal and receives an output signal of the second delay gate at a clock terminal.

2. A digital system comprising:
the spike noise eliminating circuit according to claim 1; and
a digital block for video display control that processes an output signal of the spike noise eliminating circuit as a synchronization signal.

3. An IIC bus comprising:
the spike noise eliminating circuit according to claim 1; and
an IIC bus transmission/reception control part that processes an output signal of the spike noise eliminating circuit as a communication signal.

4. A spike noise eliminating circuit comprising:
a first delay gate that delays an input signal by a predetermined period of time;
an arithmetic logic circuit that performs an exclusive logical operation on an output signal of the first delay gate and the input signal;
a second delay gate that delays an output signal of the arithmetic logic circuit; and
a flip flop circuit that receives an output signal of the first delay gate at a data terminal and receives an output signal of the second delay gate at a clock terminal.

5. A spike noise eliminating circuit comprising:
a first delay gate that delays an input signal by a predetermined period of time;
an arithmetic logic circuit that performs an exclusive logical operation on an output signal of the first delay gate and the input signal;
a second delay gate that delays an output signal of the arithmetic logic circuit;
a third delay gate that delays the input signal by a certain period of time; and
a flip flop circuit that receives an output signal of the third delay gate at a data terminal and receives an output signal of the second delay gate at a clock terminal.

* * * * *